United States Patent
Bergmann et al.

(10) Patent No.: US 9,846,319 B2
(45) Date of Patent: Dec. 19, 2017

(54) POCKELS CELL DRIVER CIRCUIT COMPRISING RESISTIVE, INDUCTIVE OR CAPACITIVE ELEMENTS

(71) Applicants: BME Messgeräte Entwicklung KG, Murnau (DE); Helmholtz-Zentrum Dresden-Rossendorf e.V., Dresden (DE)

(72) Inventors: Thorald Horst Bergmann, Murnau (DE); Fedor Bergmann, Murnau (DE); Mathias Siebold, Dresden (DE); Markus Löser, Dresden (DE)

(73) Assignees: BME Messgeräte Entwicklung KG, Murnau (DE); Helmholtz-Zentrum Dresden-Rossendorf e.V., Dresden (DE)

( * ) Notice: Subject to any disclaimer, the term of this patent is extended or adjusted under 35 U.S.C. 154(b) by 0 days.

(21) Appl. No.: 15/229,701

(22) Filed: Aug. 5, 2016

(65) Prior Publication Data

US 2017/0038610 A1    Feb. 9, 2017

(30) Foreign Application Priority Data

Aug. 6, 2015    (EP) .................................... 15401084

(51) Int. Cl.
*H03B 1/00*    (2006.01)
*H03K 3/00*    (2006.01)
(Continued)

(52) U.S. Cl.
CPC .............. *G02F 1/0327* (2013.01); *G02F 1/03* (2013.01); *H01S 3/107* (2013.01);
(Continued)

(58) Field of Classification Search
USPC ................................................. 327/108–112
See application file for complete search history.

(56) References Cited

U.S. PATENT DOCUMENTS

| 6,140,847 A * | 10/2000 | Le Campion ............ H03K 3/57 108/103 |
| 2004/0101001 A1* | 5/2004 | Bergmann ............ G02F 1/0327 372/25 |

(Continued)

FOREIGN PATENT DOCUMENTS

DE    102007053482 B3    8/2009
EP       1418460 A1       5/2004
(Continued)

OTHER PUBLICATIONS

EP Office Action cited in EP Application No. 15401084.7 dated Mar. 23, 2016, pp. 1-14.

(Continued)

*Primary Examiner* — Adam Houston
(74) *Attorney, Agent, or Firm* — Cooper Legal Group, LLC (57) ABSTRACT

The driver circuit comprises a first node (J1), which is connected to a first terminal of the Pockels cell (CP), a second node (J2), which is connected to a second terminal of the Pockels cell (CP), wherein the first node (J1) is connected to a first potential (+HV) via a first switching unit (S1) and the second node (J2) is connected to the first potential (+HV) via a second switching unit (S2) and wherein the first node (J1) is connected to a second potential (-HV) via a first resistance (R1) and the second node (J2) is connected to the second potential (-HV) via a second resistance (R2); and wherein the first node (J1) is connected to the second node (J2) via a series circuit comprising a third resistance (R3) and an inductance (L1).

20 Claims, 5 Drawing Sheets (51) Int. Cl.
   *G02F 1/03*    (2006.01)
   *H01S 3/107*   (2006.01)
   *H03K 5/07*    (2006.01)
   *H01S 3/10*    (2006.01)
   *H01S 3/16*    (2006.01)

(52) U.S. Cl.
   CPC ........ *H01S 3/10061* (2013.01); *H01S 3/1618* (2013.01); *H01S 3/1643* (2013.01); *H03K 5/07* (2013.01)

(56) References Cited

U.S. PATENT DOCUMENTS

| | | | | |
|---|---|---|---|---|
| 2011/0194576 | A1* | 8/2011 | Bergmann | G02F 1/0327 372/25 |
| 2015/0268486 | A1* | 9/2015 | Edler | G02F 1/0327 372/12 |
| 2016/0170243 | A1* | 6/2016 | Bergmann | G02F 1/0327 359/257 |
| 2017/0038610 | A1* | 2/2017 | Bergmann | G02F 1/0327 |
| 2017/0127505 | A1* | 5/2017 | Sunahara | H05G 2/008 |

FOREIGN PATENT DOCUMENTS

| | | | |
|---|---|---|---|
| WO | 2009103313 | A1 | 8/2009 |
| WO | 2014027227 | A1 | 2/2014 |

OTHER PUBLICATIONS

EP Search Report cited in EP Application No. 15401084.7 dated Jan. 15, 2016, pp. 1-7.

* cited by examiner

POCKELS CELL DRIVER CIRCUIT COMPRISING RESISTIVE, INDUCTIVE OR CAPACITIVE ELEMENTS

RELATED APPLICATION

This application claims priority to European Patent Application 15 401 084.7, filed on Aug. 6, 2015, which is incorporated herein by reference.

TECHNICAL FIELD

The present disclosure relates to a driver circuit for a Pockels cell, to a Pockels cell comprising such a driver circuit, and to a laser system comprising a Pockels cell and such a driver circuit.

BACKGROUND

In laser systems, electro-optical modulators such as Pockels cells can be used for switching or selecting laser pulses. A Pockels cell can be switched back and forth between two states by means of a suitable switchable high-voltage supply. The voltage required to attain the two states respectively mentioned is a function of the crystal parameters and the used wavelength of the light to be switched.

In experiments conducted prior to this application, it was found that during standard operation of a Pockels cell with a rectangular voltage profile, the initial optical contrast of the Pockels cell can decrease greatly. Such a decrease in the optical contrast can have a disadvantageous effect on optical systems, in particular laser amplifiers, for example.

SUMMARY

According to an aspect the present disclosure relates to an improved driver circuit for a Pockels cell, in particular to such a driver circuit with which the voltage present at the Pockels cell can be manipulated. According to a further aspect the present disclosure relates to a driver circuit for a Pockels cell with which, in particular in the case of medium to relatively long opening times of the Pockels cell, the optical contrast can be kept as far as possible virtually constant during the opening time of the Pockels cell.

BRIEF DESCRIPTION OF THE DRAWINGS

The accompanying drawings are provided to ensure a further understanding of embodiments and are integrated into the present description and form part thereof. The drawings show embodiments and together with the description serve for elucidating principles of embodiments.

DETAILED DESCRIPTION

Insofar as the following description, the patent claims or the drawings express that circuit elements are "connected", "connectable", "electrically connected" or "electrically coupled" to one another, this can mean that the elements mentioned are coupled to one another directly, i.e. without further elements situated therebetween. However, it can also mean that the elements mentioned are not directly coupled to one another and that further elements are coupled between the elements mentioned. Insofar as identical reference signs are used in the figures, they refer to identical or functionally identical elements, and so the description of these elements is not repeated in these cases. In the context of this application, the term "inductance" is also used synonymously with the term "inductance device", the term "resistance" is also used synonymously with the term "resistance device", or "resistor", and the term "capacitor" is also used synonymously with the term "capacitor device", and the term "capacitance" is also used synonymously with the term "capacitance device".

In accordance with a first aspect, the present disclosure relates to a driver circuit for a Pockels cell.

Figure 1A:
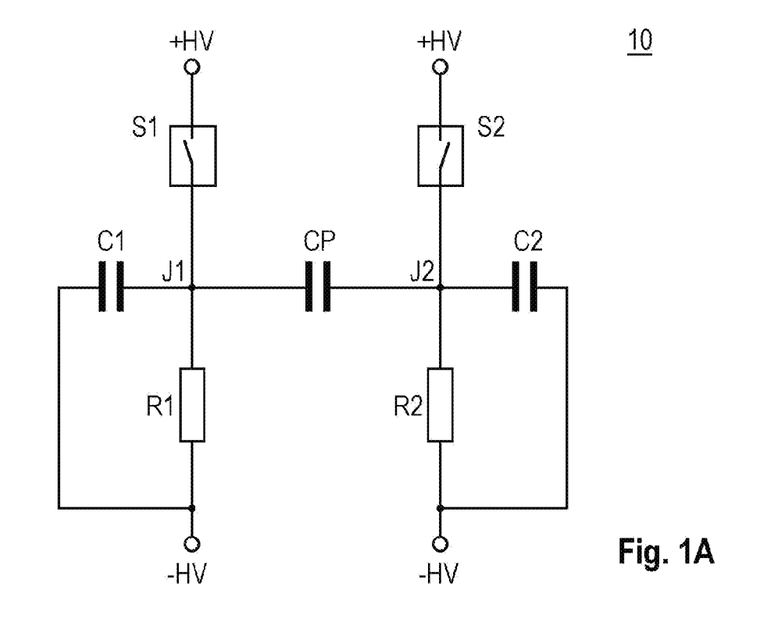
FIG. 1A shows a schematic illustration of a differential driver circuit in accordance with one exemplary embodiment without components connected in parallel with the Pockels cell.
Figure 1B:
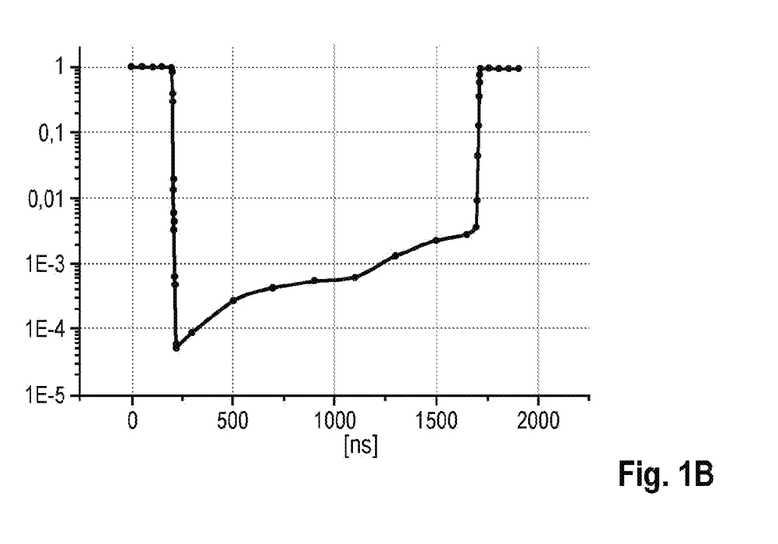
FIG. 1B shows a measured contrast/time diagram of a Pockels cell driven by a differential driver circuit in accordance with one exemplary embodiment without components connected in parallel with the Pockels cell.

FIG. 1 comprises FIGS. 1A and 1B, and FIG. 1A shows a schematic illustration of one exemplary embodiment of a driver circuit for a Pockels cell. The driver circuit 10 contains a first node J1, which is connected to a first terminal of a Pockels cell CP, and a second node J2, which is connected to a second terminal of the Pockels cell CP. The first node J1 is connected to a first potential +HV via a first switching unit S1, and the second node J2 is connected to the first potential +HV via a second switching unit S2. Furthermore, the first node J1 is connected to a second potential −HV via a first resistance R1 and the second node J2 is connected to the second potential −HV via a second resistance R2. The driver circuit furthermore comprises parasitic capacitances C1 and C2 respectively situated between the nodes J1 and J2 and the second potential −HV.

The driving of this driver circuit takes place in such a way that firstly both switching units S1 and S2 are open. In this way, the Pockels cell CP is voltageless. The switching unit S1 is then closed, as a result of which the voltage +HV is present at the Pockels cell CP. If the switching unit S2 is subsequently closed, the Pockels cell CP is discharged again.

After a waiting time predefined by the application, for example 1 μs, both switches are simultaneously opened, whereby both terminals of the Pockels cell CP are pulled to the value of the present high voltage −HV with a time constant predefined by R1 and C1, and respectively by R2 and C2.

In order to examine the optical contrast of the Pockels cell CP in terms of its time dependence, the Pockels cell CP is positioned between two parallel polarizers. The driver circuit 10 was operated such that the opening time of the Pockels cell CP, that is to say the time period between the closing of the first switching unit S1 and the closing of the second switching unit S2, was 1.5 μs. In order to measure the optical contrast of the Pockels cell CP during its opening time, a laser pulse having a time duration of 8 ns was drawn from a regenerative amplifier and the pulse of the Pockels cell CP was thus sampled. In particular, the laser pulse was generated in an unchanged manner temporally and the switching of the Pockels cell was delayed relative to the laser pulse. The corresponding time on the x-axis was then calculated from the temporal delay between laser pulse and Pockels cell pulse. In order then to determine the contrast, two photodiodes were employed, one of which measured the power of the beam fed to it from a 50% beam splitter upstream of the Pockels cell. The other photodiode measured the optical power that was still present downstream of the analyzer.

FIG. 1B illustrates the measured contrast/time diagram. As is evident, contrast decreases from $5 \times 10^{-5}$ to $4 \times 10^{-3}$ in the course of the Pockels cell pulse having a length of 1.5 μs. This decrease in contrast can be explained by the following three effects:

1. the voltage applied to the Pockels cell is not constant over relatively long time periods. When the voltage is applied to the node J1, by means of capacitance coupling the potential at the node J2 is also raised simultaneously. However, J2 is then discharged to a potential −HV via the resistance R2, which has the consequence that the voltage between J1 and J2 becomes greater.
2. The Pockels cell CP comprises an electro-optically active crystal composed of KD*P material. This crystal relaxes on a μs time scale. It thus adapts to the applied electric field with increasing time duration, as a result of which the optical contrast of the Pockels cell decreases.
3. Rapidly applying a voltage to the crystal triggers a piezoelectric oscillation which has a period of approximately 10 μs and also alters the optical contrast with the same period.

Figure 2A:
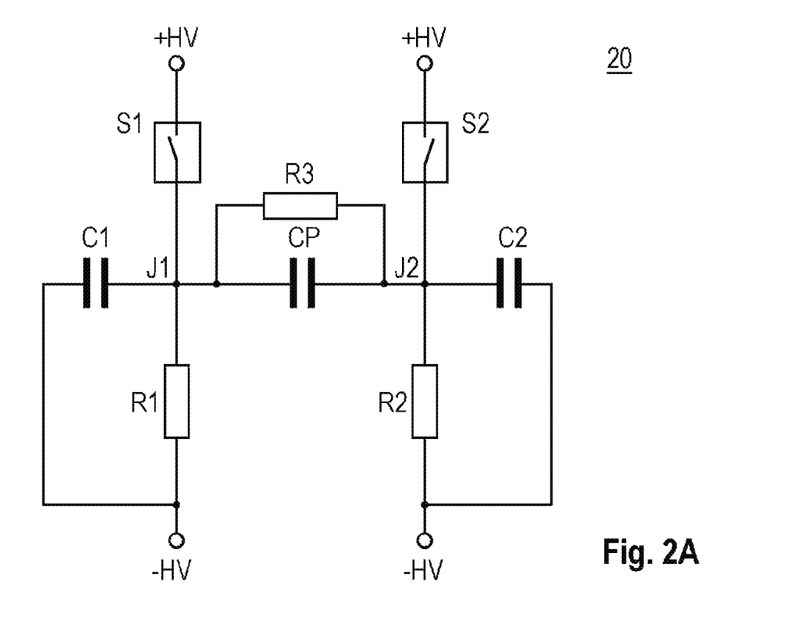
FIG. 2A shows a schematic illustration of a differential driver circuit in accordance with one exemplary embodiment with a resistance connected in parallel with the Pockels cell.
Figure 2B:
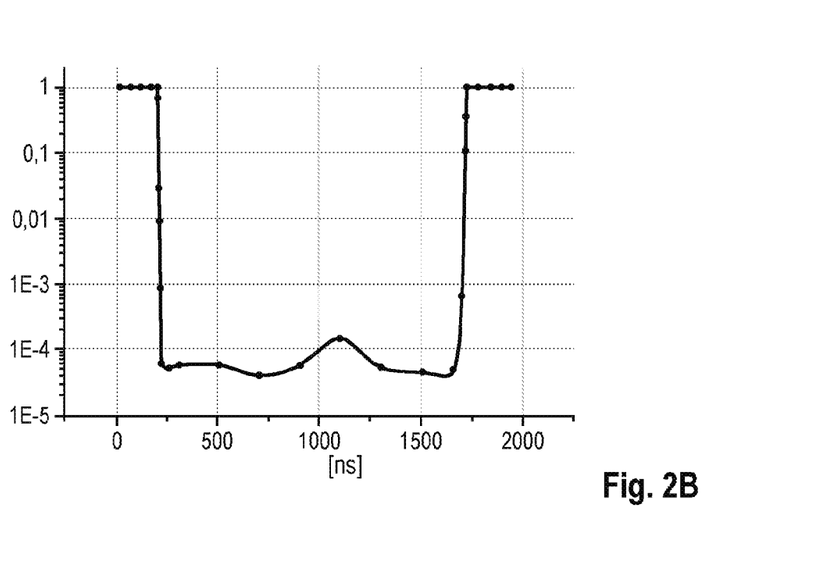
FIG. 2B shows a measured contrast/time diagram of a Pockels cell driven by a differential driver circuit in accordance with one exemplary embodiment with a resistance connected in parallel with the Pockels cell.

FIG. 2 comprises FIGS. 2A and 2B. FIG. 2A shows one exemplary embodiment of a differential driver circuit 20, which, in addition to the driver circuit 10 in FIG. 1A, comprises a third resistance R3 connected in parallel with the Pockels cell CP. FIG. 2B illustrates the contrast/time diagram for this driver circuit. Since the circuit is linear over the time period of a few microseconds, the rising voltage at the Pockels cell can be compensated for by the third resistance R3, wherein to be precise the voltage at the beginning and at the end of the opening time of the Pockels cell is set via the third resistance R3. The third resistance R3 can also be used partly to compensate for the relaxation of the crystal, but not the piezoelectric oscillation of the crystal. The measurement curve shows a maximum relative deviation from the average contrast of 55%. In this measurement, the parasitic capacitance of the Pockels cell CP=6 pF and the resistance value of the third resistance R3=820 kΩ.

Figure 3A:
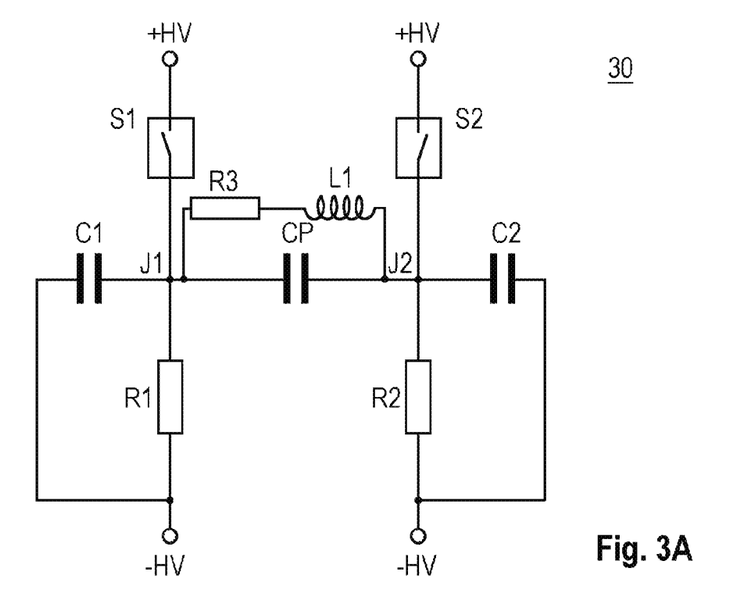
FIG. 3A shows a schematic illustration of a differential driver circuit in accordance with one exemplary embodiment with a series circuit comprising a resistance and an inductance, said series circuit being connected in parallel with the Pockels cell.

FIG. 3 comprises FIGS. 3A and 3B and shows in FIG. 3A a differential driver circuit 30, in which the first node J1 is connected to the second node J2 via a series circuit comprising a third resistance R3 and an inductance L1 and which otherwise is embodied like the driver circuits 10 and 20 in FIGS. 1 and 2. The addition of the inductance L1 now makes it possible to set the voltage at the beginning and at the end and also in the center of the pulse. The effect of the inductance L1 substantially consists in the Pockels cell CP no longer being discharged linearly, but rather exponentially. Specifically this means that the discharge is firstly effected relatively slowly, that is to say that a small current flow takes place. With increasing duration, the current flow increases toward a maximum value and the discharge becomes linear. Depending on the values of the components, after sometime an equilibrium is established which depends only on the resistances R1, R2 and R3. The voltage at the Pockels cell attains a constant value of $U(CP)=(U0 \times R3)/(R2+R3)$ (U0 applied voltage).

Figure 3B:
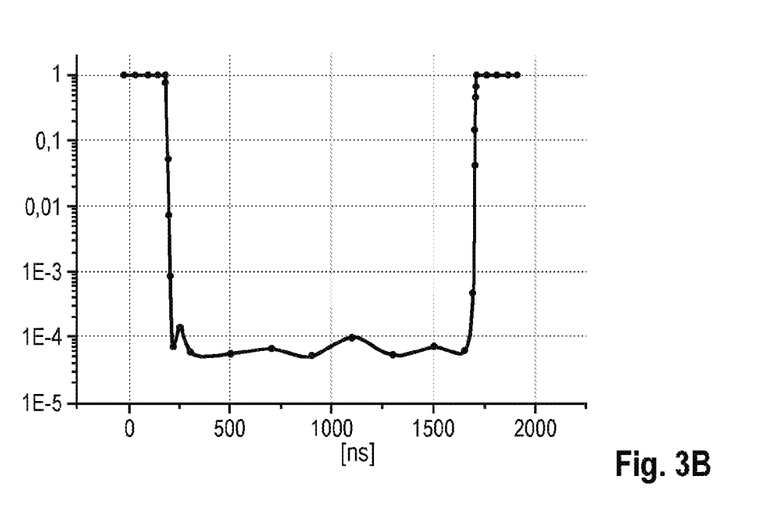
FIG. 3B shows a measured contrast/time diagram of a Pockels cell driven by a differential driver circuit in accordance with one exemplary embodiment with a series circuit comprising a resistance and an inductance, said series circuit being connected in parallel with the Pockels cell.

It should be expected that the driver circuit 30 in FIG. 3 yields good results on account of the piezoelectric oscillations for a time duration up to T/4, wherein T is the period duration of the oscillation in the crystal (given KD*P: T=10 μs). The measurement with this driver circuit 30, as shown in FIG. 3B, shows that therewith the maximum relative deviation from the average contrast of the pulse is only 32%, which corresponds to a relative improvement of 71% in comparison with the driver circuit 20 in FIG. 2. It should be expected that an even better compensation can be achieved by more accurate adaptation of the inductance L1 and the third resistance R3. In the measurement in FIG. 3B, the parasitic capacitance of the Pockels cell CP=6 pF, the resistance value of the third resistance R3=400 kΩ and the inductance value of the inductance L1=9 mH.

In accordance with one exemplary embodiment of the driver circuit 30 in FIG. 3, the inductance L1 is formed by an inductance component, in particular a cylindrical coil. This involves in particular an inductance component designed for operation at voltages in the kV range.

In accordance with one exemplary embodiment of the driver circuit 30 in FIG. 3, the resistance value of the third resistance R3 is in a range of 100 kΩ-2000 kΩ.

In accordance with one exemplary embodiment of the driver circuit 30 in FIG. 3, the inductance value of the inductance L1 is in a range of 1 mH-20 mH.

In accordance with one exemplary embodiment of the driver circuit 30 in FIG. 3, the two switching units S1 and S2, with regard to their internal construction, are provided by a simple (high-voltage) transistor or a (high-voltage), transistor chain.

In accordance with one exemplary embodiment of the driver circuit 30 in FIG. 3, the resistance value of the first resistance R1 is in a range of 100 kΩ-1000 kΩ.

In accordance with one exemplary embodiment of the driver circuit 30 in FIG. 3, the resistance value of the second resistance R2 is in a range of 100 kΩ-1000 kΩ.

Figure 4:
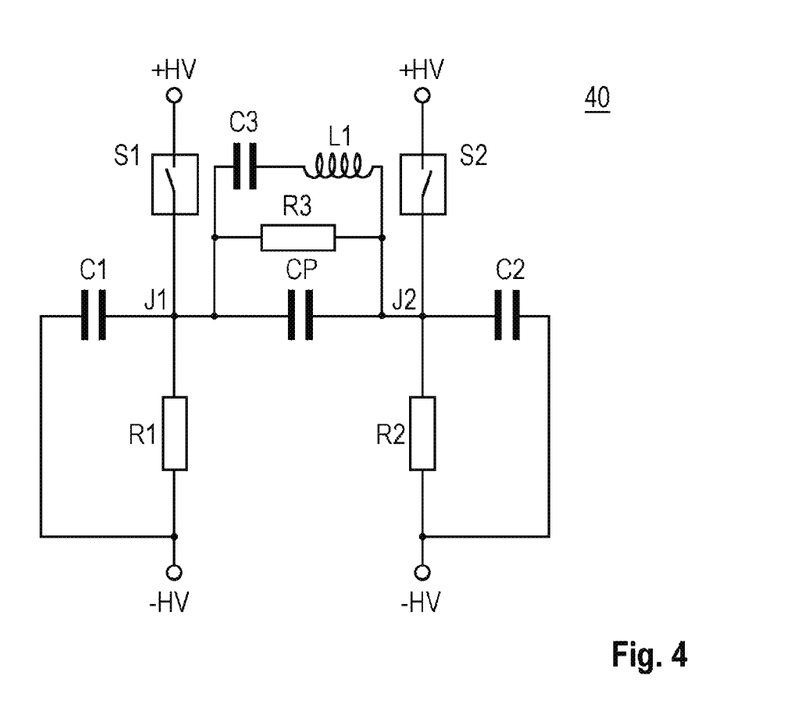
FIG. 4 shows a schematic illustration of a differential driver circuit in accordance with one exemplary embodiment with a resonant circuit connected in parallel with the Pockels cell.

FIG. 4 shows a differential driver circuit 40, in which the first node J1 is connected to the second node J2 via a resonant circuit and which otherwise is embodied like the driver circuits 10 and 20 in FIGS. 1 to 3. The resonant circuit has a third resistance R3, a capacitance 03 and an inductance L1. Specifically, the first node J1 is connected to the second node J2 via a third resistance R3 connected in parallel with the Pockels cell CP, wherein a series circuit comprising the capacitance 03 and the inductance L1 is also connected in parallel therewith.

In accordance with one exemplary embodiment of the driver circuit 40 in FIG. 4, the resistance value of the third resistance R3 is in a range of 0-2000 kΩ.

In accordance with one exemplary embodiment of the driver circuit 40 in FIG. 4, the inductance value of the inductance L1 is in a range of 100 μH-15 mH.

In accordance with one exemplary embodiment of the driver circuit 40 in FIG. 4, the capacitance value of the capacitance C3 is in a range of 2 pF-30 pF.

In accordance with a second aspect, the present disclosure relates to a Pockels cell comprising a driver circuit in accordance with the first aspect.

In accordance with a third aspect, the present disclosure relates to a laser system comprising at least one Pockels cell in accordance with the second aspect.

In accordance with a fourth aspect, the present disclosure relates to a method for operating a laser system in accordance with the third aspect.

Figure 5:
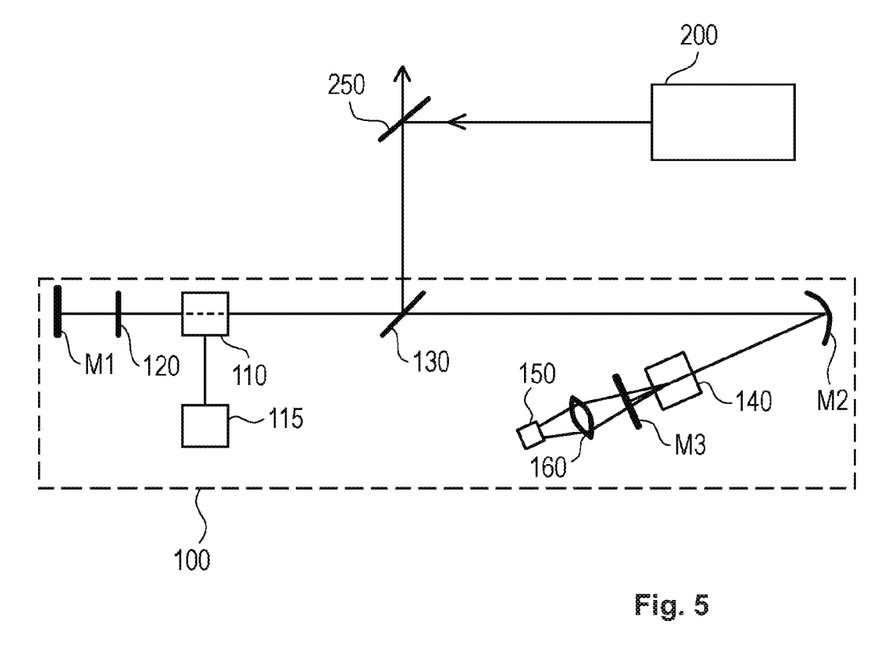
FIG. 5 shows a schematic illustration of one exemplary embodiment of a regenerative amplifier with a resonator-internal Pockels cell driven by a differential driver circuit according to one of the exemplary embodiments mentioned above.

FIG. 5 schematically illustrates one exemplary embodiment of a regenerative amplifier. The regenerative amplifier 100 is formed by the arrangement shown within the dashed line and comprises an optical resonator arranged between the highly reflective resonator end mirrors M1 and M3. Within the resonator, a Pockels cell 110, a λ/4 plate 120, a polarization-selective deflection unit 130, for example a thin-film polarizer, a deflection mirror M2, and a gain medium 140 are arranged in the beam path of the circulating laser pulses. Furthermore, the regenerative amplifier 100 comprises a pump light source 150, for example a laser diode array, and a lens 160, which are arranged outside the resonator. The Pockels cell 110 is connected to a driver circuit 115 such as has been described in one of the exemplary embodiments in FIGS. 1 to 4.

The functioning of the regenerative amplifier is as follows. A laser beam source 200 generates laser pulses having defined polarization, energy, wavelength and repetition rate. The laser pulses are coupled into the resonator of the regenerative amplifier 100 by a deflection unit 250, for example a thin-film polarizer. In the gain medium 140, a population inversion is generated by means of the pump radiation of the pump light source 150 and the lens 160 and amplifies the laser pulses passing through the gain medium 140. As a consequence, the laser pulses circulate in the resonator repeatedly as a result of reflections at the resonator end mirrors M1 and M2 and are amplified upon each pass through the gain medium 140 until a desired final gain is attained and the laser pulses are coupled out from the resonator.

The number of circulations of the laser pulses in the resonator is determined by the opening time of the Pockels cell 110. After the laser pulse has been coupled in and has passed through the still switched off Pockels cell 110, the laser pulse is rotated by 90° in terms of its polarization as a result of passing through the λ/4 plate 120 twice. After the first pass through the gain medium 140, the Pockels cell is switched on. After passing twice through the Pockels cell 110 and the λ/4 plate 120, the polarization is unchanged, such that the laser pulse experiences no deflection by the polarization-selective deflection unit 130. As long as the Pockels cell 110 thus remains in the switched-on state, the laser pulse oscillates back and forth in the resonator between the resonator end mirrors M1 and M3 and is amplified upon each pass through the gain medium 140. In order to couple out the laser pulse, the Pockels cell 110 is switched off, as a result of which the polarization is rotated by 90° after passing twice through the λ/4 plate 120 and the laser pulse is coupled out from the resonator by the deflection unit 130.

The coupled-out laser pulse is then polarized again such that it is transmitted by the polarization-selective deflection unit 250.

The desired number of pulse circulations depends, inter alia, on the properties of the gain medium 140, in particular the achievable gain in the state of the population inversion. The gain medium can have for example an intrinsically low gain governed, as is known, by the material, as is the case for example for materials such as Yb:CaF2 or Yb:glass. However, the gain medium can likewise have an intrinsically high gain, in which case, however, owing to the external constitution, the gain achievable during operation in the case of a single pass through the gain medium has only relatively low values. By way of example, in the case Yb:YAG—that is to say actually a high-gain material—in the case of an embodiment in the form of thin plates the (single-pass) gain may be only in the range of 1.05-1.4. Furthermore, a long circulation time, e.g. 50 ns for comparatively long pulses, may require a long opening time of the Pockels cell even in the case of few circulations. Furthermore, if lossy optical systems such as gratings, saturable absorbers or the like are present in the resonator, this either by itself or in combination with the cases mentioned above may also lead to a desired high number of circulations. Moreover, given high pulse repetition rates, the gain per pulse may decrease and this may then likewise be a cause of long opening times.

In all these cases, a comparatively long opening time of the Pockels cell is necessary or desirable in order to be able to achieve a desired final gain. That means that the opening time of the Pockels cell 110 should be greater than 100 ns, in particular greater than 200 ns, in particular greater than 300 ns, in particular greater than 400 ns, in particular greater than 500 ns. However, the opening time can also be far longer for instance up to 10 is or more, which typically corresponds to a number of 200 to 500 pulse circulations in the resonator, depending on the resonator length. Particularly with such long opening times, it is extremely important that the Pockels cell has a contrast that is as constant as possible over the entire opening time, and brings about as far as possible minimum resonator-internal losses or a maximum pre-pulse contrast, since an excessively low pre-pulse contrast is tantamount to radiation coupled out before the actual laser pulse. This can be made possible by the described exemplary embodiments of driver circuits. With uniformly high contrast, in addition it is also possible to suppress post-pulses that may arise as a result of still circulating and amplified radiation owing to a main pulse not being coupled out perfectly.

While the disclosure has been illustrated and described with regard to one or more implementations, amendments and/or modifications can be made to the examples illustrated, without departing from the concept and scope of protection of the accompanying claims. In particular, with regard to the different functions carried out by the components or structures described above, the expressions described for describing such components, unless indicated otherwise, are intended to correspond to an arbitrary component or structure which carries out the specified function of the described component (which is e.g. functionally equivalent), even if it is not structurally equivalent to the disclosed structure which carries out the function in the exemplary implementations of the disclosure as illustrated herein.

What is claimed is:

1. A driver circuit, comprising:
   a first node, which is connected to a first terminal of a Pockels cell; and
   a second node, which is connected to a second terminal of the Pockels cell; wherein:
   the first node is connected to a first potential via a first switching unit and the second node is connected to the first potential via a second switching unit,
   the first node is connected to a second potential via a first resistance and the second node is connected to the second potential via a second resistance, and
   the first node is connected to the second node via a series circuit comprising a third resistance and an inductance.

2. The driver circuit as claimed in claim 1, wherein:
   a resistance value of the third resistance is in a range of 100 kΩ to 2000 kΩ.

3. The driver circuit according to claim 1, wherein:
   an inductance value of the inductance is in a range of 1 mH to 20 mH.

4. The driver circuit as claimed in claim 1, wherein at least one of:
   a resistance value of the first resistance is in a range of 100 kΩ to 10000 kΩ, or a resistance value of the second resistance is in a range of 100 kΩ to 1000 kΩ.

5. A Pockels cell comprising the driver circuit as claimed in claim 1.

6. A laser system comprising at least one Pockels cell comprising the driver circuit as claimed in claim 1.

7. The laser system as claimed in claim 6, further comprising
   a regenerative amplifier comprising a resonator, in a beam path of which a gain medium and the Pockels cell are arranged.

8. A method for operating the laser system as claimed in claim 7, wherein:
   the Pockels cell is driven in such a way that laser pulses are circulated in the resonator an opening time of greater than 100 ns.

9. The laser system as claimed in claim 7, wherein:
   the gain medium comprises Yb:CaF2, Yb:glass, Yb:KGW, Yb:KYW, Yb:CAlGO, Yb:CALYO, Yb:YAG, Ti:sapphire or Nd:glass.

10. A method for operating the laser system as claimed in claim 9, wherein:
    the Pockels cell is driven in such a way that laser pulses are circulated in the resonator an opening time of greater than 100 ns.

11. A driver circuit, comprising
    a first node, which is connected to a first terminal of a Pockels cell; and
    a second node, which is connected to a second terminal of the Pockels cell; wherein:
    the first node is connected to a first potential via a first switching unit and the second node is connected to the first potential via a second switching unit,
    the first node is connected to a second potential via a first resistance and the second node is connected to the second potential via a second resistance,
    the first node is connected to the second node via a third resistance and a series circuit comprising a capacitance and an inductance, and
    the series circuit is connected in parallel with the third resistance.

12. The driver circuit as claimed in claim 11, wherein:
    an inductance value of the inductance is in a range of 100 µH to 15 mH.

13. The driver circuit as claimed in claim 11, wherein:
    a capacitance value of the capacitance is in a range of 2 pF to 30 pF.

14. The driver circuit as claimed in claim 11, wherein at least one of:
    a resistance value of the first resistance is in a range of 100 kΩ to 1000 kΩ,
    a resistance value of the second resistance is in a range of 100 kΩ to 1000 kΩ, or
    a resistance value of the third resistance is in a range of 100 kΩ to 2000 kΩ.

15. A Pockels cell comprising the driver circuit as claimed in claim 11.

16. A laser system comprising at least one Pockels cell comprising the driver circuit as claimed in claim 11.

17. The laser system as claimed in claim 16, further comprising
    a regenerative amplifier comprising a resonator, in a beam path of which a gain medium and the Pockels cell are arranged.

18. A method for operating the laser system as claimed in claim 17, wherein:
    the Pockels cell is driven in such a way that laser pulses are circulated in the resonator an opening time of greater than 100 ns.

19. The laser system as claimed in claim 17, wherein:
    the gain medium comprises Yb:CaF2, Yb:glass, Yb:KGW, Yb:KYW, Yb:CAlGO, Yb:CALYO, Yb:YAG, Ti:sapphire or Nd:glass.

20. A method for operating the laser system as claimed in claim 19, wherein:
    the Pockels cell is driven in such a way that laser pulses are circulated in the resonator an opening time of greater than 100 ns.

* * * * *

UNITED STATES PATENT AND TRADEMARK OFFICE
CERTIFICATE OF CORRECTION

PATENT NO. : 9,846,319 B2
APPLICATION NO. : 15/229701
DATED : December 19, 2017
INVENTOR(S) : Bergmann et al.

It is certified that error appears in the above-identified patent and that said Letters Patent is hereby corrected as shown below:

In the Claims

Column 7, Line 25, Claim 4 delete "10000 kΩ" and insert therefor --1000 kΩ--.

Signed and Sealed this
First Day of May, 2018

Andrei Iancu
*Director of the United States Patent and Trademark Office*